United States Patent
Hwee et al.

(12)

(10) Patent No.: US 6,510,976 B2
(45) Date of Patent: Jan. 28, 2003

(54) METHOD FOR FORMING A FLIP CHIP SEMICONDUCTOR PACKAGE

(75) Inventors: Tan Kim Hwee, Singapore (SG); Romeo Emmanuel P. Alvarez, Singapore (SG)

(73) Assignee: Advanpack Solutions Pte. Ltd., Singapore (SG)

( * ) Notice: Subject to any disclaimer, the term of this patent is extended or adjusted under 35 U.S.C. 154(b) by 0 days.

(21) Appl. No.: 09/861,020

(22) Filed: May 18, 2001

(65) Prior Publication Data

US 2002/0170942 A1 Nov. 21, 2002

(51) Int. Cl.[7] ............................................. B23K 31/02
(52) U.S. Cl. .................. 228/180.22; 228/215; 228/223
(58) Field of Search ....................... 228/180.21, 180.22, 228/215, 245, 201, 202, 205, 206, 207, 214, 223

(56) References Cited

U.S. PATENT DOCUMENTS

| | | | |
|---|---|---|---|
| 5,027,188 A | * | 6/1991 | Owada et al. ............... 257/737 |
| 5,439,162 A | * | 8/1995 | George et al. ......... 228/180.22 |
| 5,597,469 A | * | 1/1997 | Carey et al. ................. 205/118 |
| 5,704,116 A | * | 1/1998 | Gamota et al. ........ 228/180.22 |
| 5,879,964 A | * | 3/1999 | Paik et al. ................... 438/107 |
| 5,956,605 A | * | 9/1999 | Akram et al. .......... 228/180.22 |
| 5,994,783 A | * | 11/1999 | You ............................ 257/712 |
| 6,236,112 B1 | * | 5/2001 | Horiuchi et al. ............. 257/734 |
| 6,277,670 B1 | * | 8/2001 | You ............................. 438/106 |

FOREIGN PATENT DOCUMENTS

JP 05326630 * 12/1993

OTHER PUBLICATIONS

US 2002/0043721A1 Weber (Apr. 18, 2002).*
WO 90/07792 Altman et al. (Jul. 12, 1990).*

* cited by examiner

*Primary Examiner*—Tom Dunn
*Assistant Examiner*—Kiley Stoner
(74) *Attorney, Agent, or Firm*—Schwabe, Williamson & Wyatt, P.C.

(57) ABSTRACT

An oxidized (220) copper leadframe and a semiconductor die with copper posts extending from die pads, and with solder balls coated (225) with flux on the end of the copper posts, are provided. The semiconductor die is placed (230) on the oxidized copper leadframe, with the solder balls abutting portions of the layer of oxide, above and aligned with, interconnect locations on the leadframe. When reflowed (235), the flux on the abutting portions of the oxide layer selectively cleans these portions of the oxide layer, away from the interconnect locations. In addition, the solder balls change to molten state and adhere to the cleaned copper surfaces at the interconnect locations. Advantageously, the rest of the oxide layer that is not cleaned away provides a passivation layer that advantageously contains and prevents the molten solder from flowing away from the interconnect locations.

41 Claims, 5 Drawing Sheets

METHOD FOR FORMING A FLIP CHIP SEMICONDUCTOR PACKAGE

FIELD OF THE INVENTION

The present invention relates to forming a flip chip semiconductor package on a leadframe, and more particularly to forming a flip chip semiconductor package on a bare copper leadframe.

BACKGROUND OF THE INVENTION

In semiconductor packaging, a relatively sensitive and difficult to handle semiconductor die is encapsulated in a package with external connections. Packaging allows the semiconductor die to be more conveniently handled, and it also allows external circuitry to be easily coupled thereto.

A known method of semiconductor packaging employs a plated leadframe. A leadframe is a patterned sheet of metal, typically copper, that has been plated, usually with silver, nickel or palladium. Plating is necessary to prevent the copper from oxidizing, and to provide a surface to which solder will adhere or, when employing wire bonding, gold or aluminum can be bonded. The pattern of the sheet of metal provides a leadframe for forming a semiconductor package.

Typically, the leadframe includes a flag portion for mounting a semiconductor die with the back of the die being bonded to the flag portion or paddle; and lead portions extending inwardly towards the flag portion. During the packaging process, lengths of wire are bonded between pads on the die and the lead portions, and subsequently the die, flag portion, lengths of wire and part of the lead portions are encapsulated, usually in mold compound; leaving parts of the lead portions exposed for external electrical connections.

Currently, plated leadframes for forming flip chip semiconductor packages have leads with inner lead portions and outer lead portions. The inner lead portions are arranged in a pattern with interconnect locations on the inner lead portions matching the pattern of pads on a semiconductor die. The semiconductor die is bumped with copper posts extending from pads on the die, and solder balls are attached to the free ends of the copper posts.

U.S. patent application Ser. No. 09/564,382 by Francisca Tung, filed on Apr. 27, 2000, titled "Improved Pillar Connections For Semiconductor Chips and Method Of Manufacture", and Continuation-In-Part U.S. patent application Ser. No. (Not yet assigned) by Francisca Tung, filed on Apr. 26, 2000 titled "Improved Pillar Connections For Semiconductor Chips and Method Of Manufacture", and assigned to a common assignee as this patent application, teaches forming pillar structures as described herein. These patent applications are incorporated by reference.

During assembly, flux is either printed on the interconnect locations on the leadframe or the solder balls are dipped in flux. After fluxing, the semiconductor die is flipped over, and placed on the leadframe. The solder balls abutting the interconnect locations on the inner lead portions and the flux wetting the interconnect locations and the solder balls. The assembly is then reflowed.

Under elevated reflow temperatures, the flux cleans the plated surface of the interconnect locations, and the solder balls melt and adhere to the interconnect locations. Thus, forming solder interconnects between the free ends of the copper posts on the semiconductor die, and the interconnect locations on the leadframe.

After reflow, when normal flux is used the assembly is cleaned to remove residual flux and encapsulated in mold compound. However, when no-clean flux is employed, the cleaning step is not required. The resultant package is known as a flip chip on leadframe semiconductor package.

A disadvantage of this process is the need for a plated leadframe as plating adds to the cost of the package. Another disadvantage is, when the solder balls melt, the molten solder flows across the surface of the lead portions as there is nothing on the plated surface of the leadframe to control or inhibit the flow of the molten solder. This flow of solder is often referred to as overrun, and results in a variety of adverse effects in such flip chip semiconductor packages form on leadframe.

A first concern is, when the solder flows away from an interconnect location, the respective interconnect has less solder than required to provide a reliable electrical connection. A second concern is, interconnects with the reduced amount of solder do not support the semiconductor die evenly. Consequently, the planarity of the semiconductor die on the leadframe can be adversely affected, and a non-planar die can give rise to shorting between copper posts on the die. This condition is referred to as a collapsed die.

A third concern is the overrun results in solder flowing over the edges and onto the opposite surface of the lead portions. Later, during molding the mold compound will not adhere well to the affected surfaces. A fourth concern is known as wicking. Wicking occurs when a lead portion on a leadframe is shaped such that there is a small gap between the side of a downset die and the lead, and where there is an interconnect location close to the edge of the die. In this arrangement, the solder from the interconnect location can flow along the lead and, through capillary action, flow upwards through the small gap.

In an effort to reduce costs of flip chip semiconductor packages on leadframe, un-plated or bare copper leadframes, simply referred to as copper leadframes, have been tried. However, to a large extent, the copper leadframes suffered the same disadvantages discussed hereinabove, as the plated leadframe. In addition, copper tends to oxidize when left exposed and solder cannot adhere well to copper oxide.

BRIEF SUMMARY OF THE INVENTION

The present invention seeks to provide a method for forming a flip chip semiconductor package, which overcomes or at least reduces the abovementioned problems of the prior art.

Accordingly, in one aspect, the present invention provides a method for forming a flip chip semiconductor package, the method comprising the steps of:

a) providing a patterned layer of metal conductors having a first surface, wherein the first surface has a pattern of interconnect locations thereon;

b) forming a layer of passivation on the first surface of the patterned layer of metal conductors;

c) providing a semiconductor die having a first surface with a pattern of pads thereon, wherein reflowable conductive deposits are disposed on the pads;

d) selectively disposing a passivation cleaner;

e) placing the semiconductor die on the patterned layer of metal conductors to form an assembly, wherein the reflowable conductive deposits abut portions of the layer of passivation, wherein the reflowable conductive deposits are adjacent the pattern of interconnect locations, and wherein the passivation cleaner adheres to the reflowable conductive deposits and the portions of the layer of passivation; and f) reflowing the assembly, wherein the passivation cleaner substantially removes the portions of the layer of passivation from the patterned layer of metal conductors, and wherein the reflowable conductive deposits form conductive interconnects between the pads on the semiconductor die and the interconnect locations on the patterned layer of metal conductors.

In another aspect, the present invention provides a method for forming a flip chip semiconductor package, the method comprising the steps of:

a) providing a patterned layer of metal conductors having a first surface, wherein the first surface has a pattern of interconnect locations thereon;

b) forming a layer of passivation on the first surface of the patterned layer of metal conductors;

c) providing a semiconductor die having a first surface with a pattern of pads thereon, wherein electrical conductors extend from the pads, and wherein solder deposits are disposed on free ends of the electrical conductors;

d) selectively disposing flux;

e) placing the semiconductor die on the patterned layer of metal conductors to form an assembly, wherein the solder deposits abut portions of the layer of passivation, wherein the solder deposits are adjacent the pattern of interconnect locations, and wherein the flux adheres to the solder deposits and the portions of the layer of passivation; and f) reflowing the assembly, wherein the flux substantially removes the portions of the layer of passivation from the patterned layer of metal conductors, wherein the solder deposits form solder interconnects between the electrical conductors on the semiconductor die and the interconnect locations on the patterned layer of metal conductors, and wherein the layer of organic material vaporizes and provides passivation while vaporizing.

BRIEF DESCRIPTION OF THE DRAWINGS

An embodiment of the present invention will now be fully described, by way of example, with reference to the drawings of which.

DETAILED DESCRIPTION OF THE DRAWINGS

An oxidized copper leadframe is used to form a flip chip semiconductor package, without first removing the layer of oxidation. A semiconductor die with copper posts extending from die pads, and with solder balls attached is dipped in flux to coat the solder balls with flux. The semiconductor die is then placed on the oxidized leadframe, with the solder balls abutting portions of the layer of oxide above, and aligned with, interconnect locations on the leadframe. When reflowed, the flux on the portions of the oxide layer selectively cleans these portions of the oxide layer off the interconnect locations. Thus, advantageously allowing the solder balls to melt and adhere to cleaned copper surfaces at the interconnect locations. In addition, the rest of the oxide layer that is not cleaned away provides a passivation layer that advantageously contains and prevents the molten solder from flowing away from the interconnect locations. Alternatively, a layer of antioxidant may be used as a layer of passivation which vaporizes when the solder interconnects are being formed.

Figure 1:
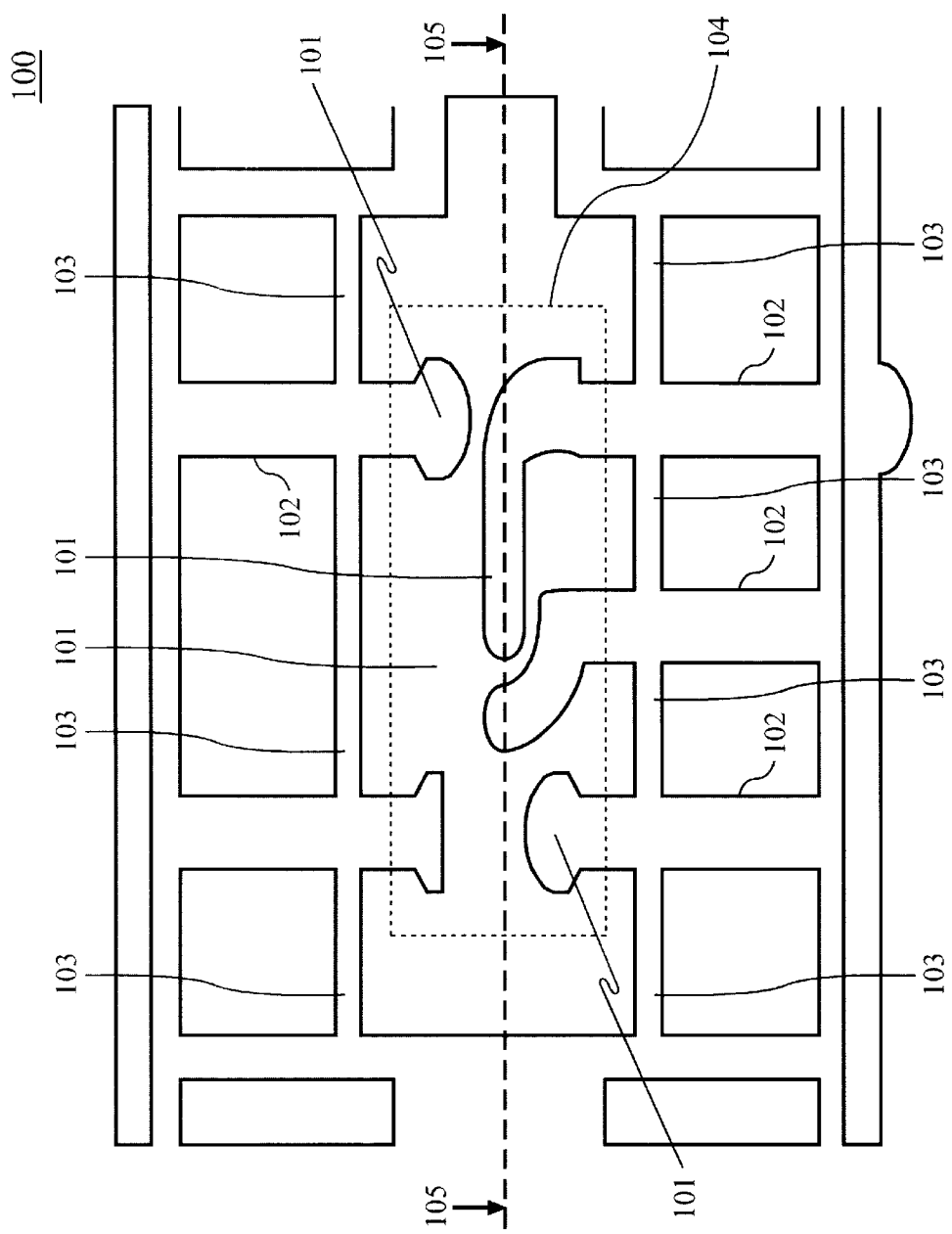
FIG. 1 shows a copper leadframe for a flip chip semiconductor package.
Figure 2:
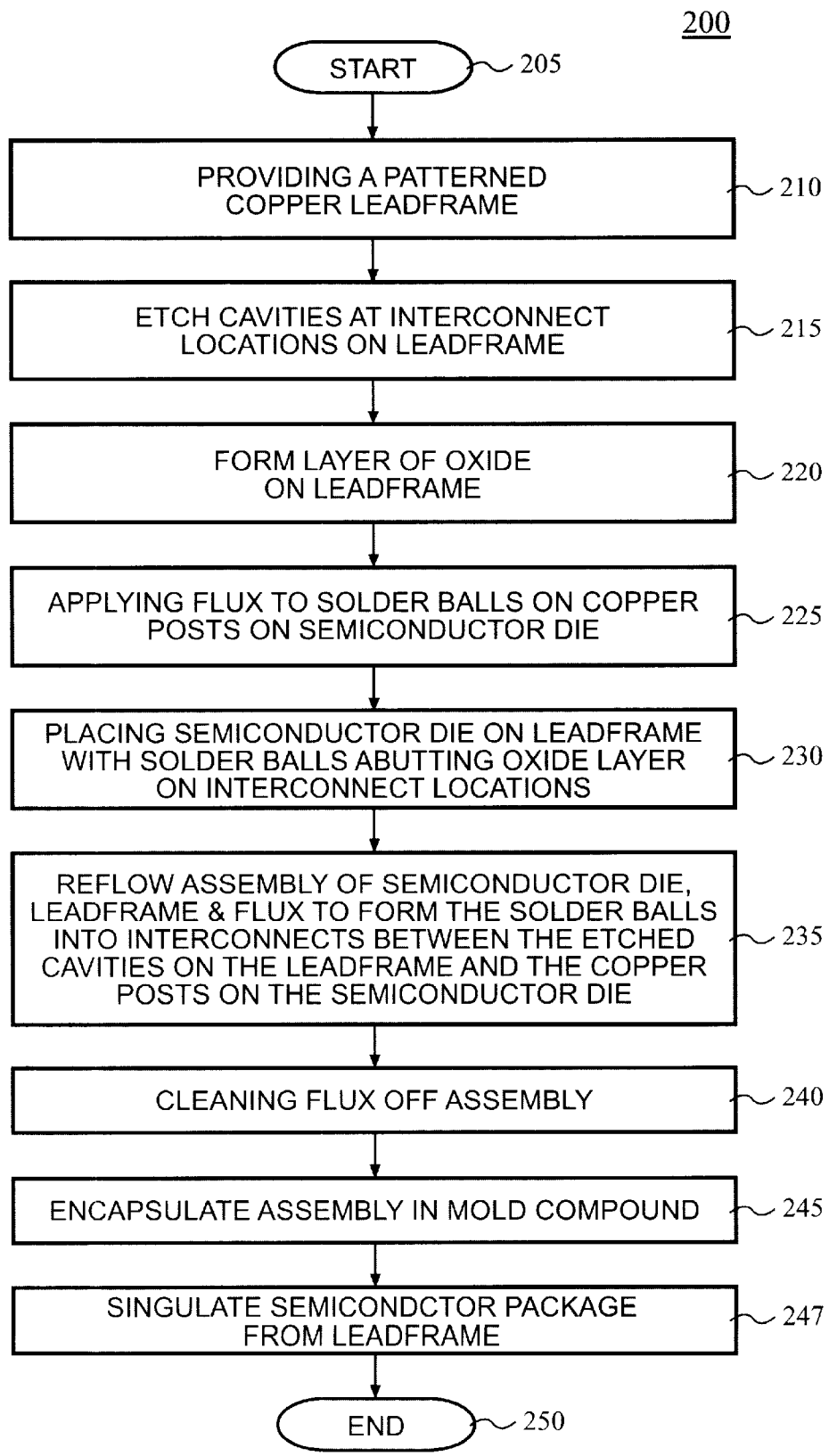
FIG. 2 shows a flowchart detailing a process for forming the semiconductor package with a semiconductor die and the copper leadframe in FIG. 1.

FIG. 1 shows a part of a copper leadframe 100 which has inner lead portions 101, outer lead portions 102 and dambar portions 103. The outline 104 indicates the location for placing a semiconductor die (not shown) on the leadframe 100. After a semiconductor package (not shown) is formed on the leadframe 100, the inner lead portions 101, which are coupled to the semiconductor die, will be enclosed with the semiconductor die in the package, and the outer lead portions 102 will extend from the package. The dambar portions 103 define an outline of the package, and provide a seal during the molding process that encapsulates the semiconductor die and the inner lead portions 102 in the package. Typically, the leadframe 100 is supplied by a vendor in a strip, on which several packages are formed, as is known in the art.

With reference to FIG. 2 and FIGS. 3A–E a process 200 for forming a flip chip semiconductor package on the leadframe 100, in accordance with the present invention, starts 205 with providing 210 the copper leadframe 100. The leadframe 100 is a patterned metal leadframe, which provide a patterned layer of metal conductors, and can comprise a stamping from a sheet of metal, such as copper. Alternatively, the leadframe 100 can be produced by etching a copper sheet. When the thickness of the sheet of metal is relatively small, the leadframe 100 can comprise flexible circuits, also known as flex circuits, which includes a flexible substrate. In addition, the leadframe 100 as referred to herein extends to substrates including ceramic, laminate, polyimide substrate, and tape.

Figure 3A:
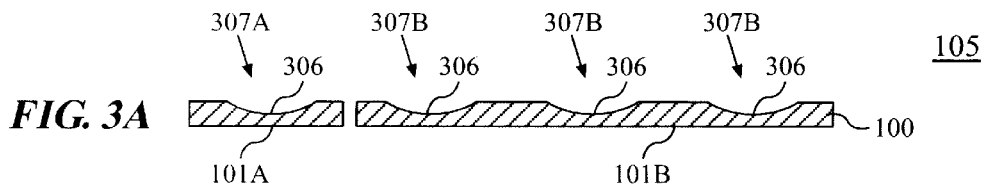
FIGS. 3A–E shows cross-sectional views of a part of the copper leadframe in FIG. 1 and the semiconductor die during the process in FIG. 2.
Figure 3B:
Figure 3C:
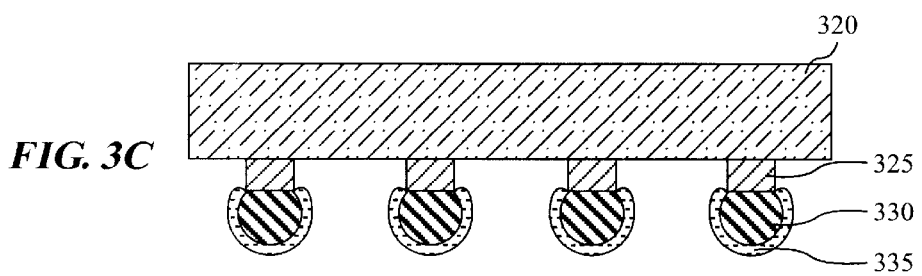
Figure 3D:
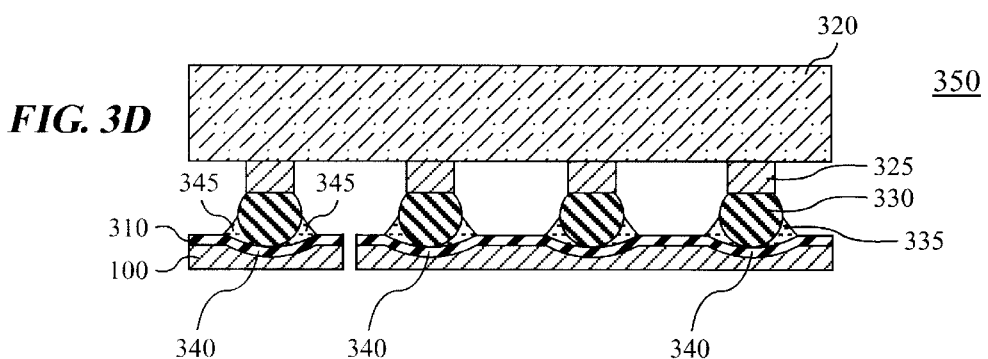
Figure 3E:
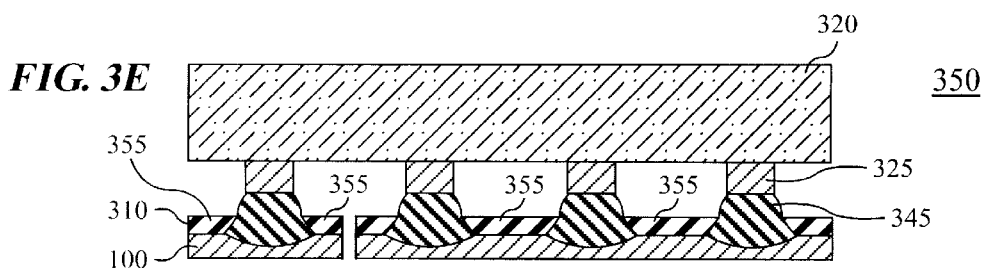
Figure 4:
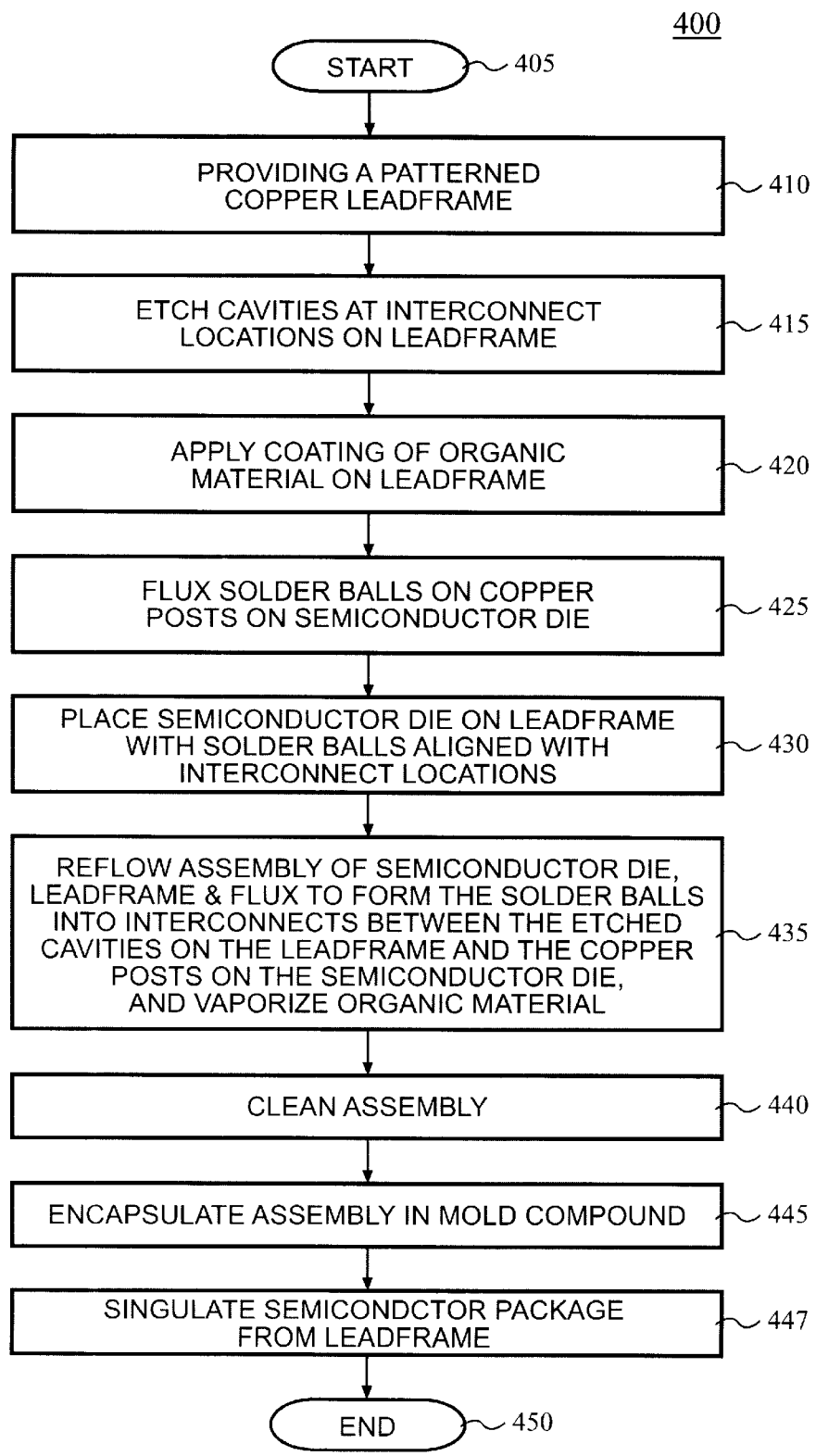
FIG. 4 shows a flowchart detailing a process for forming a semiconductor package with a semiconductor die and the copper leadframe in FIG. 1.

The leadframe 100 may be etched 215 to form cavities 306 at interconnect locations 307. Two inner lead portions 101A and 101B are shown in FIG. 3A, one 101A with one interconnection location 307A having one cavity 306A, and another 101B with three interconnection locations 307B having three cavities 306B.

The interconnection locations 307 form a pattern that corresponds to the pattern of pads on a semiconductor die which will be mounted on the leadframe 100. The etched cavities 306 provide a catchment for enhancing containment of molten solder, as will be evident later in the process 200. In addition, the cavities 306 also provide an increased surface area for solder to adhere. It should be noted that the cavities 306 on the leadframe 100 enhances the process 200, and is not a mandatory step. The solder can adhere to the interconnect locations 307 without the cavities 306. The present invention as described can be practiced without the need for forming the cavities 306 at the interconnect locations 307 on the leadframe 100.

A layer of oxide 310 is then formed 220 on the leadframe 100. Typically, the layer of oxide 310 may be formed 220 on the leadframe 100 when the leadframe 100 is left exposed to ambient conditions with a relatively high humidity. This is because copper tends to oxidize more readily than some other metals. Hence, forming the layer of oxide 310 may require the step of leaving the leadframe 100 exposed in ambient conditions for a predetermined period of time.

Alternatively, the formation of the layer of oxide 310 may be enhanced in a controlled environment where the temperature is elevated and the humidity increased. For example, the leadframe 100 can be baked in an oven for a predetermined period of time in a chamber with a high relative humidity. Alternatively, simply baking the leadframe 100 can result in the required oxide layer 310 being formed on the leadframe 100, without the need to control humidity.

Solder does not adhere well to the oxide layer. In accordance with the present invention, the layer of oxide on copper is a layer of passivation, which can be patterned around interconnect locations on a copper leadframe, like a solder mask, to prevent the solder from flowing away from the interconnect locations. Hence, the oxide layer 310 can be formed on the leadframe 100 in accordance with a predetermined passivation pattern.

A semiconductor die 320 with a pattern of pads (not shown) that corresponds to the pattern of cavities 306 is provided for mounting on the leadframe 100. The semiconductor die 320 includes electrical conductors, such as copper posts 325 extending from the pads. A reference to a process of forming the copper posts 325 on a semiconductor wafer was mentioned earlier. The wafer is then diced to produce the bumped semiconductor die 320. In addition, the semiconductor die 320 includes reflowable conductive deposits such as solder deposits or solder balls 330, that are attached to the free ends of the copper posts 325. The solder balls 330 can be attached by a variety of techniques, as will be known to one skilled in the art. Alternatively, where the semiconductor die is not bumped, the solder balls 330 can be attached directly to the solder pads.

Next, a cleaning agent or passivation cleaner, such as flux 335, is applied or coated 225 on the solder balls 330 on the semiconductor die 320 by coating the solder balls 330 with the flux 335. This is often achieved by positioning the semiconductor die 320 with the solder balls 330 dipped in the flux 335. At elevated temperatures, the flux 335 cleans a surface to which it is applied, so that the solder adheres to the cleaned surface. After the flux 335 is applied, the semiconductor die 320 is ready to be mounted on the leadframe 100. Alternatively, the flux 335 can be printed on the leadframe 100 in accordance with a pattern that corresponds to pattern of the interconnect locations 307 on the leadframe 100.

The semiconductor die 320 is then positioned above the leadframe 100, and the solder balls 330 are aligned with the interconnect locations 307 on the leadframe 100. After aligning the solder balls 330 with the interconnect locations 307, the semiconductor die 320 is placed 230 on the leadframe 100. Placing here can include exerting and maintaining a predetermined force on the semiconductor die 330 against the leadframe 100.

When the semiconductor die 320 is placed on the leadframe 100, the lower surface of the solder balls 330 abut portions 340 of the oxide layer 310 at the interconnect locations 307, and the flux 335 on the solder balls 330 flow into the wedge shaped space 345 between the lower surface of the solder balls 330 and the surface of the oxide layer 310. The flux 335 on the solder balls 330 wets or adheres to the portions 340 of the oxide layer 310 at the interconnect locations 307, in preparation for the next step. The portions of the oxide layer 310 that are wet by the flux determine those portions that will be selectively cleaned off or removed from the interconnect locations 307.

Several parameters affect the selective removal of the portions 340 of the oxide layer 310. These parameters include the type of flux that is employed and the amount of oxide that is to be removed. For example, a flux by Alphametals of the USA, known as WS609, has been used with favorable results on a bare copper leadframe. The reliability of the resultant flip chip semiconductor package is a measure as to the particular selection of these parameters for a particular type of semiconductor package. One measure of the reliability is the occurrence of open circuits as a result of open joints or cracks. Hence, the type of flux that is used and the oxide layer that is formed, will tend to vary between different types of flip chip on leadframe semiconductor packages.

The assembly 350 of the semiconductor die 320, the leadframe 100, the oxide layer 310, and the flux 335, is then reflowed 235. During reflow 235, the flux 335 cleans the portions 340 of the oxide layer 310 off the interconnect locations 307 on the leadframe 100, and the solder balls 330 change to a molten state. The molten solder 345 flows onto the cleaned surface of the interconnect locations 307, and adheres to the cleaned surface. However, the portions 355 of the oxide layer 310 surrounding the interconnect locations 307 are not cleaned away, and these portions 355 act as passivation or solder mask, containing the molten solder 345 at the interconnect locations 307. Consequently, the molten solder 345 can run up the copper posts 325. This can improve the surface area of the copper posts 325 to which the solder 345 adheres, which can increase the mechanical strength of the coupling between the copper posts 325 and the leadframe 100, thus producing more reliable electrical coupling.

Hence, the present invention, as described, selectively removes portions of the oxide layer at the interconnect locations, advantageously, leaving the rest of the oxide layer as passivation on the leadframe to prevent molten solder at the interconnect locations from flowing away. Thus, improving the coupling between the copper posts and the leadframe.

After reflowing 235, when normal flux is used, the assembly 350 is cleaned to remove any access flux, and the assembly 350 is encapsulated 245 in mold compound (not shown) to produce a flip chip semiconductor package (not shown) on the leadframe 100. Alternatively, when no-clean flux is employed, cleaning is not required. Subsequently, after a final step of singulating the semiconductor package from the leadframe 100, during which the dam bar portions 103 are severed, the process 200 ends 250.

As is known to one skilled in the art, there may be the additional steps of forming the external lead portions 102, and testing the functionality of the semiconductor die 320, prior to singulation.

With reference to FIG. 4 and FIGS. 5A–F an alternate process 400 for forming a flip chip semiconductor package on the leadframe 100, in accordance with the present invention, starts 405 with providing 410 the copper leadframe 100. As before, the leadframe 100 may be etched 415 to form the cavities 306 at the interconnect locations 307. Here, the copper leadframe 100 is supplied, prior to oxidation forming thereon, or after oxidation has been removed from the leadframe 100.

A coating of organic material 510 is then applied 220 on the leadframe 100. The coating material can comprise Cuoprotec, which produced by LeaRonal of the USA. Typically, the organic material 510 is supplied in liquid form and application is by immersing the copper leadframe 100 in the organic material 510. Effectively, the organic material forms a protective film over the surface of the copper leadframe 100, which inhibits oxidation.

Solder does not adhere well to the organic material 510, in accordance with the present invention, the coating of organic material 510 is a layer of passivation which can be patterned around a solder interconnect location on a copper leadframe to prevent the solder from flowing away from the interconnect location.

Next, flux 335 is applied 425 to the solder balls 330 on the semiconductor die 330 as described earlier, and the semiconductor die 320 is ready to be mounted on the leadframe 100.

The semiconductor die 320 is then positioned above the leadframe 100, and the solder balls 335 are aligned with the interconnect locations 307 on the leadframe 100. Upon alignment, the semiconductor die 320 is placed 430 on the leadframe 100. Again, placing here can include exerting and maintaining a predetermined force on the semiconductor die assembly 332 against the leadframe 100.

When the semiconductor die 320 is placed on the leadframe 100, the lower surface of the solder balls 330 abut portions 540 of the coating of organic material 510 at the interconnect locations 307, and the flux 335 on the solder balls 330 flow into the wedge shaped space 545 between the lower surface of the solder balls 330 and the surface of the coating of organic material 510. This wets the surface of the coating of organic material 510 at the interconnect locations 307 with the flux 335, in preparation for the next step.

The assembly 550 of the semiconductor die 320, the leadframe 100, the coating of organic material 510, and the flux 135, is then reflowed 435. During reflow 435, the flux 335 cleans the portions 540 of the coating of organic material 510 off the interconnect locations 307 on the leadframe 100, and the solder balls 330 change to a molten state. The molten solder 555 flows onto the cleaned surface of the interconnect locations 307, and adheres to the cleaned surface. However, the portions 560 of the coating of organic material 510 surrounding the interconnect locations 307 are not cleaned away, but begin to vaporize, and the non-vaporized part of portions 560 act as passivation, containing the molten solder 555 at the interconnect locations 307. Consequently, the molten solder 555 can run up the copper posts 325 and can bring the benefits identified earlier.

Figure 5A:
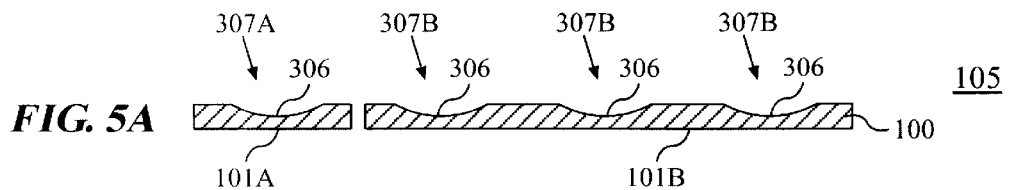
FIGS. 5A–F shows cross-sectional views of a part of the copper leadframe in FIG. 1 and the semiconductor die during the process in FIG. 4.
Figure 5B:
Figure 5C:
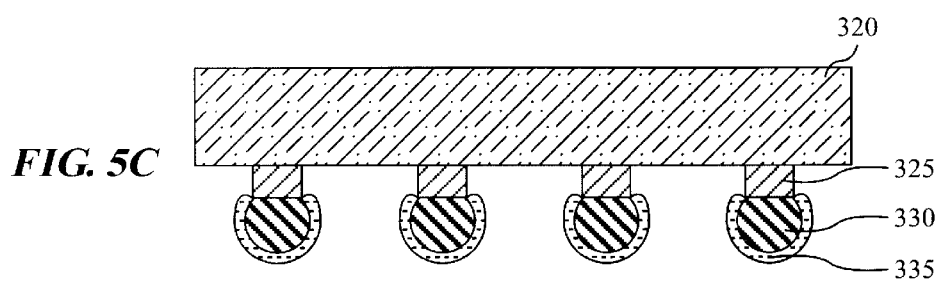
Figure 5D:
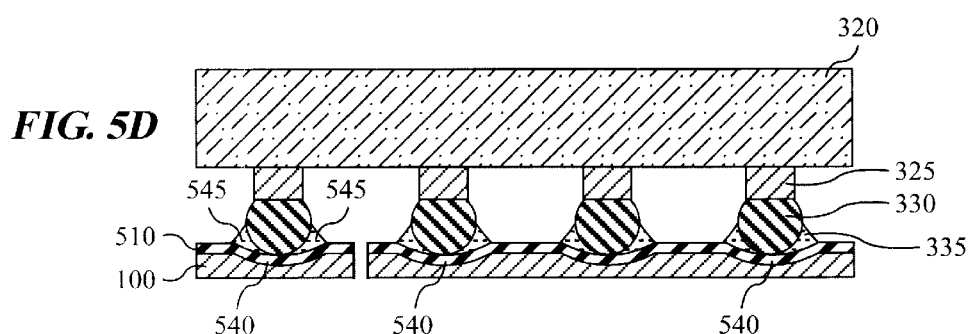
Figure 5E:
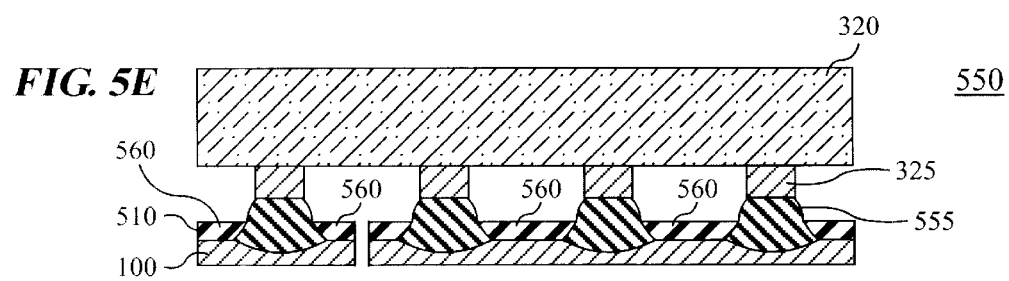
Figure 5F:
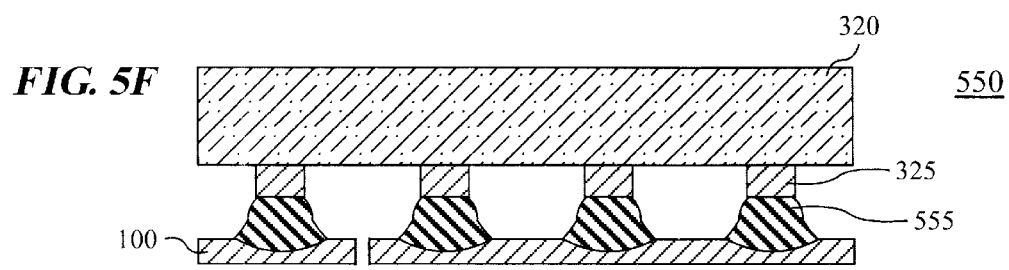

When reflowing 435 the assembly 550 the solder forms interconnects between the semiconductor die 320 and the leadframe 100, while the portions 560 of the coating of organic material 510 vaporizes off the leadframe 100 until the organic material 510 has completely vaporized off the leadframe 100, as shown in FIG. 5F.

Subsequently, the assembly 550 is cleaned 440, if normal flux is employed, encapsulated 445, and the semiconductor package thus formed is singulated 447 from the leadframe 100. When no-clean flux is used, cleaning is not required. There are of course the same considerations of shaping the outer lead portions 102 and testing prior to singulation 447.

It will be appreciated that many of the considerations as applied to the instance when a layer of oxide is used to from a passivation will also apply when a layer of organic material is employed as the passivation layer, as will be known to one skilled in the art.

Hence, the present invention, as described, uses a non-oxidized copper leadframe with a coating of organic material. The reflow process selectively removes portions of the coating of organic material at the interconnect locations, advantageously, vaporizing the rest of the coating of organic material. The vaporizing organic material provides passivation on the leadframe to prevent molten solder at the interconnect locations from flowing away. Subsequently, the rest of the coating of organic material vaporizes off the leadframe after the solder interconnects have been formed.

The present invention, as described, provides a method of forming a flip chip semiconductor package on a copper leadframe that has a layer of oxidation, where the layer of oxidation inhibits the flow of solder away from interconnect locations on the leadframe. In addition, a layer of anti-oxidant can be used in a similar way.

This is accomplished by selectively applying flux to remove portions of the layer of oxidation off interconnect locations on the copper leadframe. The remaining portions of oxide act as a solder mask that provides passivation preventing the solder from flowing away from the interconnect locations on the copper leadframe.

Thus, the present invention, as described provides a method for forming a flip chip semiconductor package, which overcomes or at least reduces the abovementioned problems of the prior art.

It will be appreciated that although only one particular embodiment of the invention has been described in detail, various modifications and improvements can be made by a person skilled in the art without departing from the scope of the present invention.

What is claimed is:

1. A method for forming a flip chip semiconductor package, the method comprising the steps of:
   a) providing a patterned layer of metal conductors having a first surface, wherein the first surface has a pattern of interconnect locations thereon;
   b) forming a layer of passivation on the first surface of the patterned layer of metal conductors;
   c) providing a semiconductor die having a first surface with a pattern of pads thereon, wherein reflowable conductive deposits are disposed on the pads;
   d) selectively disposing a passivation cleaner;
   e) placing the semiconductor die on the patterned layer of metal conductors to form an assembly, wherein the reflowable conductive deposits abut portions of the layer of passivation, wherein the reflowable conductive deposits are adjacent the pattern of interconnect locations, and wherein the passivation cleaner adheres to the reflowable conductive deposits and the portions of the layer of passivation; and
   f) reflowing the assembly, wherein the passivation cleaner substantially removes the portions of the layer of passivation from the patterned layer of metal conductors, and wherein the reflowable conductive deposits form conductive interconnects between the pads on the semiconductor die and the interconnect locations on the patterned layer of metal conductors.

2. A method in accordance with claim 1 wherein a step after step (a) comprises the step of forming cavities in the patterned layer of metal conductors at the interconnect locations to enhance containment of the reflowable conductive deposits during step (f).

3. A method in accordance with claim 2 wherein the step of forming cavities comprises the step of etching the patterned layer of metal conductors at the interconnect locations.

4. A method in accordance with claim 1 wherein step (b) of forming a layer of passivation comprises the step of forming a layer of oxide on the first surface of the patterned layer of metal conductors.

5. A method in accordance with claim 4 wherein step (b) of forming a layer of oxide on the first surface of the patterned layer of metal conductors comprises the step of patterning a layer of oxide in accordance with a predetermined passivation pattern on the first surface of the patterned layer of metal conductors.

6. A method in accordance with claim 4 wherein the step of forming the layer of oxide comprises the step of baking the patterned layer of metal conductors.

7. A method in accordance with claim 4 wherein the step of forming the layer of oxide comprises the step of exposing the patterned layer of metal conductors to relatively humid conditions.

8. A method in accordance with claim 1 wherein step (d) of selectively disposing the passivation cleaner, comprises the step of disposing the passivation cleaner on the reflowable conductive deposits.

9. A method in accordance with claim 8 wherein step (d) of disposing the passivation cleaner on the reflowable conductive deposits comprises the step of coating the reflowable conductive deposits with the passivation cleaner.

10. A method in accordance with claim 1 wherein step (d) of selectively disposing the passivation cleaner, comprises the step of disposing the passivation cleaner on the passivation layer in accordance with the pattern of interconnect locations.

11. A method in accordance with claim 10 wherein the step of disposing the passivation cleaner on the passivation layer comprises the step of printing the passivation cleaner on the passivation layer in accordance with the pattern of interconnect locations.

12. A method in accordance with claim 1 wherein a step prior to step (e) comprises the step of aligning the reflowable conductive deposits with the pattern of interconnect locations.

13. A method in accordance with claim 1 further comprising, after step (f), the step of encapsulating at least a part of the assembly to form a semiconductor package on the patterned layer of metal conductors.

14. A method in accordance with claim 1 further comprising, after step (f), the step of cleaning the assembly.

15. A method in accordance with claim 14 wherein the step of cleaning comprises the step of plasma cleaning.

16. A method in accordance with claim 14 further comprising, after the step of cleaning, a step of encapsulating at least a part of the assembly to form a semiconductor package on the patterned layer of metal conductors.

17. A method in accordance with claim 16 wherein the step of encapsulating comprises the step of molding.

18. A method in accordance with claim 16 further comprising, after the step of encapsulating, a step of singulating the semiconductor package from the patterned layer of metal conductors.

19. A method in accordance with claim 1 wherein step (a) comprises the step of providing a patterned copper leadframe.

20. A method in accordance with claim 19 wherein step (b) comprises the step of forming a layer of copper oxide on the patterned copper leadframe.

21. A method in accordance with claim 20 wherein step (c) comprises the step of providing the semiconductor die having the first surface with the pattern of pads thereon, wherein solder deposits are disposed on the pads.

22. A method in accordance with claim 21 wherein step (d) comprises the step of selectively disposing flux.

23. A method in accordance with claim 22 wherein step (e) comprises the step of placing the semiconductor die on the patterned copper leadframe to form the assembly, wherein the solder deposits abut portions of the layer of copper oxide, wherein the solder deposits are adjacent the pattern of interconnect locations, and wherein the flux adheres to the solder deposits and the portions of the layer of copper oxide.

24. A method in accordance with claim 23 wherein step (f) comprises the step of reflowing the assembly, wherein the flux substantially removes the portions of the layer of copper oxide from patterned copper leadframe, and wherein the solder deposits form the conductive interconnects between the pads on the semiconductor die and the interconnect locations on the patterned copper leadframe.

25. A method in accordance with claim 19 wherein step (b) comprises the step of forming a layer of antioxidant on the patterned copper leadframe to inhibit further oxidation of the patterned copper leadframe.

26. A method in accordance with claim 25 wherein step (b) comprises the step of forming a layer of organic material on the patterned copper leadframe.

27. A method in accordance with claim 26 wherein step (c) comprises the step of providing the semiconductor die having the first surface with the pattern of pads thereon, wherein solder deposits are disposed on the pads.

28. A method in accordance with claim 27 wherein step (d) comprises the step of selectively disposing flux.

29. A method in accordance with claim 28 wherein step (e) comprises the step of placing the semiconductor die on patterned copper leadframe to form the assembly, wherein the solder deposits abut portions of the layer of organic material, wherein the solder deposits are adjacent the pattern of interconnect locations, and wherein the flux adheres to the solder deposits and the portions of the layer of organic material.

30. A method in accordance with claim 29 wherein step (f) comprises the step of reflowing the assembly, wherein the flux substantially removes the portions of the layer of organic material from patterned copper leadframe, and wherein the solder deposits form the conductive interconnects between the pads on the semiconductor die and the interconnect locations on the patterned copper leadframe.

31. A method in accordance with claim 30 further comprising a step after step (f) of vaporizing remaining portions of the layer of organic material on the patterned copper leadframe.

32. A method for forming a flip chip semiconductor package, the method comprising the steps of:
  a) providing a patterned layer of metal conductors having a first surface, wherein the first surface has a pattern of interconnect locations thereon;
  b) forming a layer of passivation on the first surface of the patterned layer of metal conductors;
  c) providing a semiconductor die having a first surface with a pattern of pads thereon, wherein electrical conductors extend from the pads, and wherein solder deposits are disposed on free ends of the electrical conductors;
  d) selectively disposing flux;
  e) placing the semiconductor die on the patterned layer of metal conductors to form an assembly, wherein the solder deposits abut portions of the layer of passivation, wherein the solder deposits are adjacent the pattern of interconnect locations, and wherein the flux adheres to the solder deposits and the portions of the layer of passivation; and
  f) reflowing the assembly, wherein the flux substantially removes the portions of the layer of passivation from the patterned layer of metal conductors, wherein the solder deposits form solder interconnects between the electrical conductors on the semiconductor die and the interconnect locations on the patterned layer of metal conductors, and wherein the layer of passivation vaporizes and provides passivation while vaporizing.

33. A method in accordance with claim 32 wherein step (b) of forming a layer of passivation comprises the step of forming a layer of oxide on the first surface of the patterned layer of metal conductors.

34. A method in accordance with claim 33 wherein step (b) of forming a layer of oxide on the first surface of the patterned layer of metal conductors comprises the step of patterning a layer of oxide in accordance with a predetermined passivation pattern on the first surface of the patterned layer of metal conductors.

35. A method in accordance with claim 32 wherein step (d) of selectively disposing flux on the solder deposits comprises the step of coating the solder deposits with flux.

36. A method in accordance with claim 35 further comprising after step (f) a step of plasma cleaning the assembly.

37. A method in accordance with claim 36 further comprising, after the step of cleaning the assembly, the step of encapsulating at least a part of the assembly to form a semiconductor package on the patterned layer of metal conductors.

38. A method in accordance with claim 32 wherein step (a) comprises the step of providing a patterned copper leadframe.

39. A method in accordance with claim 38 wherein step (b) comprises the step of forming a layer of copper oxide on the patterned copper leadframe.

40. A method in accordance with claim 38 wherein step (b) comprises the step of forming a layer of antioxidant on the patterned copper leadframe to inhibit further oxidation forming on the first surface of the patterned copper leadframe.

41. A method in accordance with claim 40 wherein step (b) comprises the step of forming a layer of organic material on the patterned copper leadframe.

* * * * *